(12) United States Patent
Li et al.

(10) Patent No.: US 7,554,351 B2
(45) Date of Patent: Jun. 30, 2009

(54) CHIP BURNING SYSTEM FOR BURNING CHIPS OF MOTHERBOARD

(75) Inventors: Tao Li, Shenzhen (CN); Su-Shun Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 280 days.

(21) Appl. No.: 11/308,951

(22) Filed: May 29, 2006

(65) Prior Publication Data

US 2007/0145993 A1     Jun. 28, 2007

(30) Foreign Application Priority Data

Dec. 26, 2005   (CN) .......................... 2005 1 0121224

(51) Int. Cl.
   *G01R 31/26* (2006.01)
(52) U.S. Cl. .................................. 324/765; 324/158.1
(58) Field of Classification Search .................. None
   See application file for complete search history.

(56) References Cited

U.S. PATENT DOCUMENTS

| | | | |
|---|---|---|---|
| 5,557,559 A  * | 9/1996 | Rhodes ........................ 702/118 |
| 6,678,850 B2 * | 1/2004 | Roy et al. .................... 714/730 |
| 6,903,567 B2 * | 6/2005 | Chung et al. ................. 324/765 |
| 7,157,923 B2 * | 1/2007 | Schneider et al. ............ 324/754 |
| 7,362,632 B2 * | 4/2008 | Rehm et al. .................. 365/201 |
| 2005/0141296 A1 | 6/2005 | Zhang |
| 2006/0023544 A1 * | 2/2006 | Yamada ....................... 365/222 |

* cited by examiner

*Primary Examiner*—Paresh Patel
(74) *Attorney, Agent, or Firm*—Wei Te Chung

(57) ABSTRACT

A chip burning system includes a burning device (10) with a plurality of burning files stored therein, a transforming circuit (30) for connecting to chips via serial interfaces, a control unit (20) interconnecting the burning device and the transforming circuit via parallel interfaces, and two chips (40,50) for burning. The transforming circuit includes a parallel-to-serial conversion module (301). The control unit includes a terminal (28) configured to output a chip choosing signal to the transforming circuit for choosing one chip from the two chips. The burning device transmits a parallel type burning file to the transforming circuit via the control unit. The transforming circuit transforms the burning file into serial type with the parallel-to-serial conversion module, and the transformed burning file is burned into the chosen chip.

16 Claims, 2 Drawing Sheets

CHIP BURNING SYSTEM FOR BURNING CHIPS OF MOTHERBOARD

FIELD OF THE INVENTION

The present invention relates to a system for burning chips, and more particularly to a system for burning chips on a motherboard.

DESCRIPTION OF RELATED ART

Generally, motherboards have a plurality of chips for different functions, such as BIOS (Basic Input Output System) chips, network card chips, and so on.

Conventionally, the chips are burned before being attached to the motherboard. A typical chip-burning device includes a buffer, a micro processing unit, a burning unit, and a communication circuit. After a chip is burned by the chip-burning device, the chip is attached to the motherboard. However, pins of the chip are easily damaged during attachment to the motherboard due to misalignment of the pins to corresponding through holes of the motherboard.

Another method of burning chips is to burn a chip after it is attached to the motherboard. A motherboard test machine that has a burning function is used to transfer the data to the chip via a serial port and burn the data into the chip. However, the machine can burn only one chip at a time, which is time consuming and expensive.

What is needed, therefore, is a more efficient system for burning chips of a motherboard.

SUMMARY OF THE INVENTION

A chip burning system includes a burning device with a plurality of burning files stored therein, a transforming circuit for connecting to chips via serial interfaces, a control unit interconnecting the burning device and the transforming circuit via parallel interfaces, and two chips for burning. The transforming circuit includes a parallel-to-serial conversion module. The control unit includes a terminal configured to output a chip choosing signal to the transforming circuit for choosing one chip from the two chips. The burning device transmits a parallel type burning file to the transforming circuit via the control unit. The transforming circuit transforms the burning file into serial type by the parallel-to-serial conversion module, and the transformed burning file is burned into the chosen chip.

Other advantages and novel features will be drawn from the following detailed description of a preferred embodiment with attached drawings, in which:

DETAILED DESCRIPTION OF THE INVENTION

Figure 1:
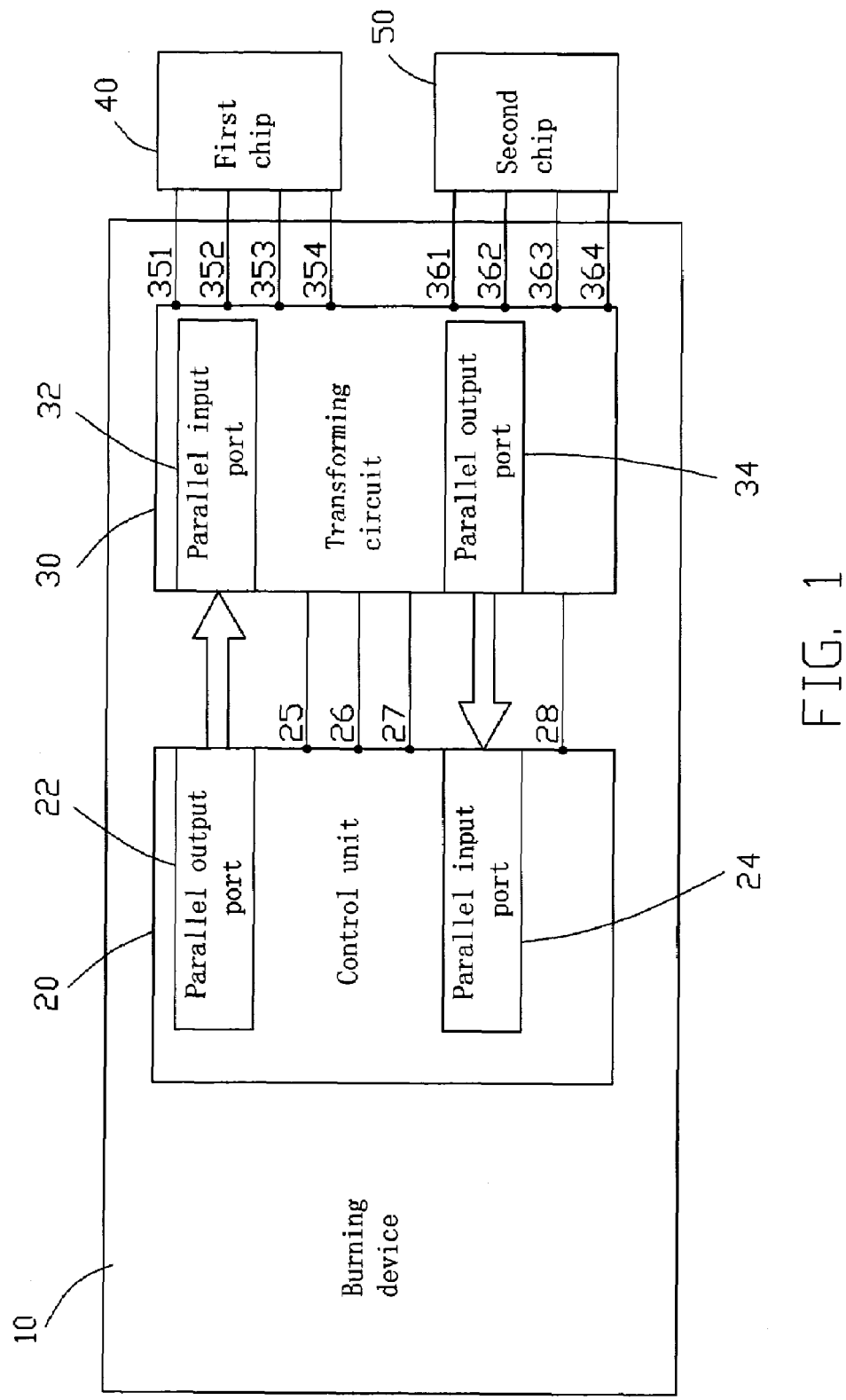
FIG. 1 is a block diagram of an exemplary chip burning system in accordance with a preferred embodiment of the present invention, which includes a burning device, a control unit, and a transforming circuit.

Referring to FIG. 1, a chip burning system in accordance with a preferred embodiment of the present invention includes a burning device 10, a control unit 20 and a transforming circuit 30 attached on the burning device 10. The chip burning system is used to burn a first chip 40 and a second chip 50 of a motherboard (not shown).

The burning device 10 stores a plurality of burning files corresponding to the first chip 40 and the second chip 50 respectively. The burning device 10 is connected to the control unit 20 via a parallel interface.

The control unit 20 is used to control the burning process. The control unit 20 includes a parallel output port 22, a parallel input port 24, and a plurality of control terminals 25, 26, 27, and 28. The control terminal 25 outputs a transmitting data signal to control the data transmission between the control unit 20 and the transforming circuit 30. The control terminal 26 outputs a read/write control signal to control reading or writing data from or to the first and second chips 40 and 50. The control terminal 27 outputs a chip-activated signal for activating a chip. The terminal 28 outputs a chip choosing signal for choosing a chip.

The transforming circuit 30 includes a parallel input port 32 connected to the parallel output port 22, and a parallel output port 34 connected to the parallel input port 24. The transforming circuit 30 has two series of terminals connected to the first chip 40 and the second chip 50 respectively. One series of terminals includes terminals 351, 352, 353, and 354, and the other series of terminals includes terminals 361, 362, 363, and 364.

The terminal 351 outputs a clock signal to the first chip 40. The terminals 352, 354 are serial interfaces. The terminal 352 is series connected to the first chip 40 for writing data to the first chip 40. The terminal 353 outputs the chip-activated signal to the first chip 40. The terminal 354 is series connected to the first chip 40 for reading data from the first chip 40.

The terminal 361 outputs a clock signal to the second chip 50. The terminal 362 is series connected to the second chip 50 for writing data to the second chip 50. The terminal 363 outputs the chip-activated signal to the second chip 50. The terminal 364 is series connected to the second chip 50 for reading data from the second chip 50.

Figure 2:
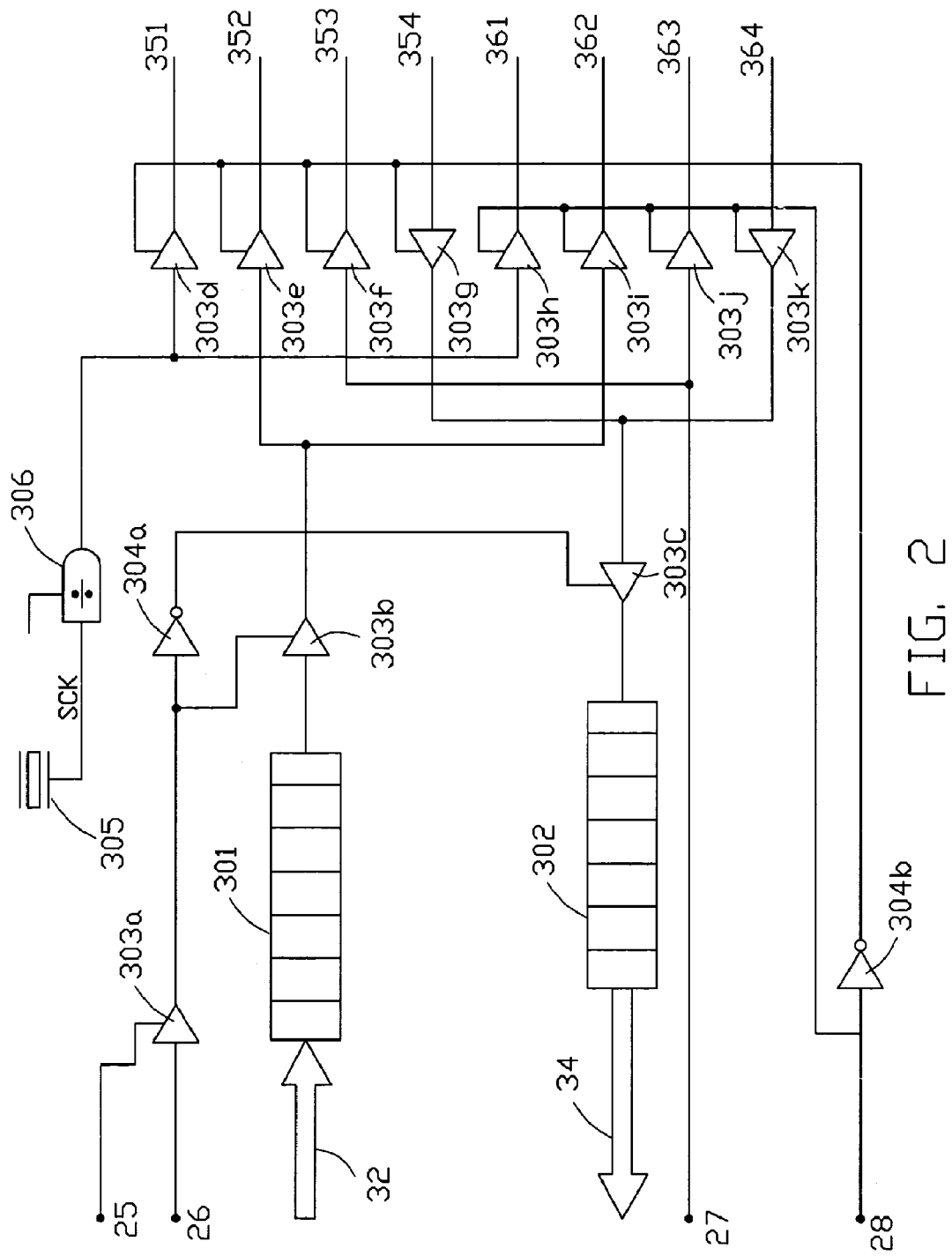
FIG. 2 is a schematic diagram of the transforming circuit of FIG. 1.

Referring to FIG. 2, the details of the transforming circuit 30 are shown. The transforming circuit 30 includes a parallel-to-serial conversion module 301, a serial-to-parallel conversion module 302, a plurality of buffers 303a to 303k, two phase inverters 304a, 304b, an oscillating crystal 305, and a frequency demultiplier 306. Each buffer includes an input terminal, an output terminal, and a control terminal.

An input terminal of the parallel-to-serial conversion module 301 is connected to the parallel input port 32. An output terminal of the parallel-to-serial conversion 301 is connected to an input terminal of the buffer 303b for transmitting data to the chips 40 and 50.

An input terminal of the serial-to-parallel conversion module 302 is connected to an output terminal of the buffer 303c. An output terminal of the serial-to-parallel conversion 302 is connected to the parallel output terminal 34.

An input terminal of the buffer 303a is connected to the terminal 26. A control terminal of the buffer 303a is connected to the terminal 25. When the terminal 25 is enabled at a high level, the buffer 303a conducts to transmit the read/write control signal from the terminal 26 to an output terminal of the buffer 303a. The output terminal of the buffer 303a is connected to the control terminal of the buffer 303b, and is connected to the control terminal of the buffer 303c via the phase inverter 304a.

Control terminals of the buffers 303d, 303e, 303f, and 303g are connected to the terminal 28 via the phase inverter 304b. Control terminals of the buffers 303h, 303i, 303j, and 303k are connected to the terminal 28 directly. When a signal on the terminal 28 is enabled at a high level, the buffers 303h, 303i, 303*j*, and 303*k* conduct, and when a signal on the terminal 28 is enabled at a low level, the buffers 303*d*, 303*e*, 303*f*, and 303*j* conduct.

The oscillating crystal 305 and the frequency demultiplier 306 are series connected and output a clock signal to input terminals of the buffers 303*d* and 303*h*. An output terminal of the buffer 303*d* is connected to the terminal 351 to provide the clock signal to the first chip 40. An output terminal of the buffer 303*h* is connected to the terminal 361 to provide the clock signal to the second chip 50.

An output terminal of the buffer 303*b* is serial connected to input terminals of the buffers 303*e* and 303*i*. An output of the terminal of the buffer 303*e* is connected to the terminal 352 to transmit data to the first chip 40. An output of the terminal of the buffer 303*i* is connected to the terminal 362 to transmit data to the second chip 50.

The terminal 27 is connected to input terminals of buffers 303*f* and 303*j*. An output terminal of the buffer 303*f* is connected to the terminal 353. An output terminal of the buffer 303*j* is connected to the terminal 363.

An input terminal of the buffer 303*c* is connected to output terminals of the buffers 303*g* and 303*k*. An input terminal of the buffer 303*g* is connected to the terminal 354 to read data from the first chip 40. An input terminal of the buffer 303*k* is connected to the terminal 364 to read data from the second chip 50.

Referring to FIGS. 1 and 2, the working principle of the chip burning system is described as follows.

Firstly, the terminal 25 is enabled at a high level so that the buffer 303*a* conducts. The terminal 28 is enabled at a low level so that the buffers 303*d*, 303*e*, 303*f*, and 303*g* conduct thereby the first chip 40 is chosen to be burned. The terminal 27 is enabled at a high level and outputs a high level chip-activated signal to the first chip 40 to activate the first chip 40.

Then, if the terminal 26 is enabled at a high level, a high level read/write control signal is transmitted to the transforming circuit 30. The transforming circuit 30 is enabled to write data into the first chip 40. The high level read/write signal switches on the buffer 303*b*, and switches off the buffer 303*c*.

The burning device 10 transmits a burning file to the control unit 20. The control unit 20 transmits the burning file to the parallel-to-serial conversion module 301 via the parallel output port 22 and the parallel input port 32. The parallel-to-serial conversion module 301 transforms the burning file from a parallel type into a serial type. The transformed burning file is then transmitted to the terminal 352 via the buffers 303*b* and 303*e*, and burned into the first chip 40.

If the terminal 26 is enabled at a low level, a low level read/write control signal is transmitted to the transforming circuit 30. The transforming circuit 30 is enabled to read data from the first chip 40. The low level read/write signal switches on the buffer 303*c*, and switches off the buffer 303*b*. The terminal 354 reads data from the first chip 40, and transmits the data to the serial-to-parallel conversion module 302 via the buffers 303*g* and 303*c*. The serial-to-parallel conversion 302 transforms the data into the parallel type, and transmits it to the control unit 20 via the parallel output port 34 and parallel input port 24. The control unit 20 then transmits the data to the burning device 10. The burning device 10 checks the data.

To burn the second chip 50, the terminal 28 is enabled at a high level. The control terminals of the buffers 303*h*, 303*i*, 303*j*, and 303*k* are enabled at a high level so that the buffers 303*h*, 303*i*, 303*j*, and 303*k* conduct. The communication between the second chip 50 and the transforming circuit 30 is enabled. Then the second chip 50 can be burned and checked as the first chip 40 described above.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A chip burning system comprising:
   at least two chips to be burned;
   a burning device with a plurality of burning files stored therein;
   a transforming circuit connected to the chips via serial interfaces, the transforming circuit comprising a parallel-to-serial conversion module; and
   a control unit interconnecting the burning device and the transforming circuit via parallel interfaces, the control unit comprising a terminal configured to output a chip choosing signal to the transforming circuit for choosing one of the at least two chips;
   wherein the burning device transmits a parallel type burning file to the transforming circuit via the control unit, the transforming circuit transforms the burning file into a serial type by the parallel-to-serial conversion module, and the transformed burning file is burned into the chosen chip.

2. The chip burning system as described in claim 1, wherein the transforming circuit further comprises a serial-to-parallel conversion module configured to transform serial data of the chosen chip into parallel data for the burning device checking the data.

3. The chip burning system as described in claim 2, wherein the control unit outputs a read/write control signal to the transforming circuit to control reading or writing data from or to the chosen chip.

4. The chip burning system as described in claim 3, wherein the read/write control signal is sent directly to a control terminal of a buffer that interconnects the parallel-to-serial conversion module and the at least two chips, and via a phase inverter the read/write control signal is sent to a control terminal of another buffer which interconnects the serial-to-parallel conversion module and the at least two chips.

5. The chip burning system as described in claim 1, wherein the transforming circuit comprises two series of buffers connecting to the at least two chips respectively.

6. The chip burning system as described in claim 5, wherein the chip choosing signal is sent to control terminals of one of the two series of buffers to control conduction of the buffers, and the chip choosing signal is sent to control terminals of the other of the two series of buffers via a phase inverter to control conduction of the buffers.

7. The chip burning system as described in claim 1, wherein the control unit outputs a chip-activated signal to the transforming circuit for activating the chips.

8. The chip burning system as described in claim 1, wherein the transforming circuit comprises an oscillating crystal and a frequency demultiplier to provide a clock signal to the two chips.

9. A chip burning system for burning a chip, comprising:
   a burning device with a plurality of burning files stored therein;
   a control unit configured to control the burning process, the control unit connected to the burning device; and
   a transforming circuit connected to the control unit via a parallel interface, and connected to the chip via a serial interface, the transforming circuit comprising a parallel-to-serial conversion module and a serial-to-parallel conversion module;

wherein the burning device transmits a burning file to the control unit, the control unit transmits the burning file to the transforming circuit via the parallel interface, the transforming circuit transforms the burning file into a serial type file by the parallel-to-serial conversion module, and burns the transformed burning file into the chip, the transforming circuit reads data from the chip and transforms the data into a parallel type file by the serial-to-parallel conversion module, and the transformed data is transmitted to the burning device for checking.

10. The chip burning system as described in claim 9, wherein the control unit outputs a read/write control signal to the transforming circuit to control reading or writing data from or to the chip.

11. The chip burning system as described in claim 10, wherein the read/write control signal is sent directly to a control terminal of a buffer that interconnects the parallel-to-serial conversion module and the chip, and via a phase inverters the read/write control signal is sent to a control terminal of another buffer which interconnects the serial-to-parallel conversion module and the chip.

12. The chip burning system as described in claim 9, wherein the transforming circuit comprises two series of buffers adapted to connect to two chips respectively.

13. The chip burning system as described in claim 12, wherein a chip choosing signal is sent to control terminals of one of the two series of buffers to control conduction of the buffers, and the chip choosing signal is sent to control terminals of the other of the two series of buffers via a phase inverter to control conduction of the buffers.

14. The chip burning system as described in claim 9, wherein the control unit outputs a chip-activated signal to the transforming circuit for activating the chip.

15. The chip burning system as described in claim 9, wherein the transforming circuit comprises an oscillating crystal and a frequency demultiplier to provide a clock signal to the chip.

16. A chip burning system comprising:
at least two chips to be burned;
a burning device storing a plurality of files therein about to be burned to each of said at least two chips; and
a control unit electrically interconnecting between said burning device and said each of said at least two chips, said control unit electrically connecting with said each of said at least two chips via a transforming circuit and outputting a chip choosing signal to said transforming circuit in order to choose a selective one of said at least two chips to be burned with said plurality of files by said transforming circuit;
wherein said control unit electrically connects with said transforming circuit via a parallel interface to transmit said plurality of files from said burning device to said transforming circuit, and said transforming circuit electrically connects with said each of said at least two chips via a serial interface to transmit said plurality of files from said transforming circuit to said each of said at least two chips after said transforming circuit transforms said plurality of files to adapt to said parallel interface and said serial interface respectively.

* * * * *